United States Patent
Gallagher et al.

(10) Patent No.: US 9,170,301 B1
(45) Date of Patent: Oct. 27, 2015

(54) HIERARCHICAL COMPACTION FOR TEST PATTERN POWER GENERATION

(71) Applicant: Cadence Design Systems, Inc., San Jose, CA (US)

(72) Inventors: Patrick Gallagher, Apalachin, NY (US); Krishna Chakravadhanula, Vestal, NY (US); Rajesh Khurana, Noida (IN)

(73) Assignee: CADENCE DESIGN SYSTEMS, INC., San Jose, CA (US)

(*) Notice: Subject to any disclaimer, the term of this patent is extended or adjusted under 35 U.S.C. 154(b) by 313 days.

(21) Appl. No.: 13/772,245

(22) Filed: Feb. 20, 2013

(51) Int. Cl.
 G01R 31/28 (2006.01)
 G01R 31/3181 (2006.01)
 G01R 31/3177 (2006.01)

(52) U.S. Cl.
 CPC ...... *G01R 31/31813* (2013.01); *G01R 31/3177* (2013.01)

(58) Field of Classification Search
 None
 See application file for complete search history.

(56) References Cited

U.S. PATENT DOCUMENTS

| | | | | |
|---|---|---|---|---|
| 5,515,383 A | * | 5/1996 | Katoozi | 714/732 |
| 7,693,676 B1 | | 4/2010 | Keller et al. | |
| 2006/0242515 A1 | * | 10/2006 | Alvamani et al. | 714/729 |
| 2010/0064190 A1 | * | 3/2010 | Ward et al. | 714/726 |
| 2011/0307748 A1 | * | 12/2011 | Laisne | 714/726 |
| 2012/0072797 A1 | * | 3/2012 | Devta-Prasanna | 714/731 |

OTHER PUBLICATIONS

Krishna Chakravadhanula, et al.; "Capture Power Reduction Using Clock Gating Aware Test Generation"; 2009; 9 pages; Paper 4.3; International Test Conference; Front-End Design Group, Cadence Design Systems, USA.

* cited by examiner

*Primary Examiner* — April Y Blair
*Assistant Examiner* — Thien D Nguyen
(74) *Attorney, Agent, or Firm* — Kaye Scholer, LLP

(57) ABSTRACT

A method and apparatus for hierarchical compaction of test patterns to be applied to an integrated circuit during test is disclosed. The embodiments apply a hierarchical strategy for categorizing test patterns for compaction. A test pattern is considered against a series of criteria for a compacted test pattern. Where all the criteria are met the test pattern is merged into a compacted test pattern. If the criteria are not all met the test patterns are considered against each of the compacted test patterns in turn. This is repeated for each test pattern to create a set of compacted test patterns conforming to the requirements of the criteria. This method and apparatus provides for fine grained control of low power constraints when testing integrated circuits, and includes benefits such as preventing damage during test from burnout and hot spots, and avoiding failures due to IR drop.

30 Claims, 4 Drawing Sheets

HIERARCHICAL COMPACTION FOR TEST PATTERN POWER GENERATION

FIELD

The present patent document relates generally to electronic design automation. In particular, the present patent document relates to a method and apparatus for hierarchical compaction of test patterns to be applied to an integrated circuit during test.

BACKGROUND

Power dissipation in advanced integrated circuit devices (chips) is increasingly of critical concern. Many modern consumer electronics are battery-operated, and lower power usage extends the battery life and useful operating time of device. Consumers demand good battery life for their devices. Excessive power consumption can also lead to the requirement for complex cooling systems to prevent overheating of electronic devices. Cooling systems require more materials and design time, making devices more expensive. As a result, circuit designers often seek to minimize the amount of power that will be used during operation by the chip they are designing. Based on the expected operation of the chip, the circuit designer will create a network of conductors to distribute power across the chip. Because power dissipation is relatively lower in a low-power device, the power distribution network is usually designed to handle a relatively lesser current.

Chips are frequently tested as part of the manufacturing process on automatic test equipment (ATE). Test patterns are applied to the chip by the ATE, which patterns can be generated as part of automatic test pattern generation (ATPG). ATPG is a method used to find an input or test sequence that, when applied to a chip, enables ATE to distinguish between the correct circuit behavior and the faulty circuit behavior caused by defects. The patterns are used to test semiconductor devices after manufacture, and in some cases to assist with determining the cause of failure (failure analysis). These test pattern typically generate much greater switching activity on the chip during scan shifting than during normal operation because of the way that ATPG tools generate test patterns.

Low power devices in particular can be adversely affected by the power generated by a large amount of switching activity during test. Features that help keep power dissipation low during operation, such as clock gating and power shut-off logic, may be disabled to allow scan testing of the entire chip. With a relatively smaller power distribution grid, the chip can be damaged from ATPG test patterns that cause the chip to exceed its power limits with high switching activity.

Most test patterns generated by ATPG have two basic stages. The scan portion loads pattern stimulus into a design and unloads from the design the logic's captured behavior to that stimulus. The release or capture portion is the application of the loaded stimulus and the capturing of the logic's behavior to the applied stimulus. The stimulus of each pattern usually contains only a very small number of care bits. A "care bit" is a flip-flop location or input port in the design that must be at a value of 1 or 0 for static test, or setup for a 0→1 or 1→0 transition for delay-type test, for the fault's good behavior to be observed by being clocked into a flip-flop or measured on the design's output port.

To reduce the number of patterns that have to be applied on the ATE tester for a given design, test patterns are compacted together. Compaction usually occurs when the care bits of one or more given patterns do not require conflicting stimulus or observable results. The goal with this compaction is to have a minimum number of patterns. As a result, the compaction rules only specify that the test patterns do not have conflicts between them, that is, the care bits do not collide. This approach can create difficulties for managing the power level of the design during the release or capture portion of the test. Merging test patterns and placing care bits into a compacted pattern without some thought can worsen switching problems during test.

SUMMARY

A method and apparatus for hierarchical compaction of test patterns to be applied to an integrated circuit during test is disclosed.

In an embodiment a method of testing an integrated circuit having a plurality of scan chains comprises receiving a plurality of test patterns from a test pattern generator to be applied to an integrated circuit, each test pattern comprising a plurality of care bits and a plurality of don't-care bits; selecting a first one of the plurality of test patterns; selecting a second one of the plurality of test patterns; determining whether to merge the second one of the plurality of test patterns with the first one of the plurality of test patterns, using a plurality of criteria ordered and applied according to a hierarchy; and if the second one of the plurality of test patterns meets each of the plurality of criteria for the first one of the plurality of test patterns, merging the second one of the plurality of test patterns with the first one of the plurality of test patterns, thereby forming a compacted test pattern.

According to another embodiment, the method further comprises selecting a third one of the plurality of test patterns; determining whether to merge the third one of the plurality of test patterns with the compacted test pattern, using the plurality of criteria ordered and applied according to the hierarchy; and if the third one of the plurality of test patterns meets each of the plurality of criteria for the compacted test pattern, merging the third one of the plurality of test patterns with the compacted test pattern, thereby forming a new compacted test pattern.

According to another embodiment, the plurality of care bits includes one or more clock gate care bits, a clock gate of a plurality of clock gates of the integrated circuit receives the one or more clock gate care bits to specify an enabled state or a disabled state for the clock gate, the clock gate controls whether a plurality of flip-flops receive a clock pulse, and a criteria of the plurality of criteria imposes an upper limit for a count of flip-flops receiving the clock pulse.

According to another embodiment, the method further comprises, for each clock gate of a plurality of clock gates of the integrated circuit, determining a count of flip-flops to receive a clock pulse from the clock gate.

According to another embodiment, the plurality of care bits includes one or more clock gate care bits, a clock gate of the plurality of clock gates receives the one or more clock gate care bits to specify an enabled state or a disabled state for the clock gate, the clock gate controls whether a plurality of flip-flops receive a clock pulse, and a criteria of the plurality of criteria imposes an upper limit for a count of flip-flops receiving the clock pulse.

According to another embodiment, a criteria of the plurality of criteria imposes an upper limit on count of flip-flops within an area of the integrated circuit.

According to another embodiment, a criteria of the plurality of criteria imposes a requirement to merge that the first one of the plurality of test patterns have no conflicting care bits with the second one of the plurality of test patterns.

According to another embodiment, the method further comprises analyzing a frequency of value changing of care bits, according to a proposed combination of the first one of the plurality of test patterns with the second one of the plurality of test patterns to generate a toggle count.

According to another embodiment, the plurality of care bits includes one or more clock gate care bits, a clock gate of a plurality of clock gates of the integrated circuit receives the one or more clock gate care bits to specify an enabled state or a disabled state for the clock gate, the clock gate controls whether a plurality of flip-flops receive a clock pulse, and a criteria of the plurality of criteria imposes an upper limit on the toggle count.

According to another embodiment, the compacted test pattern comprises a plurality of care bits and a plurality of don't-care bits arranged in a sequence, each care bit having a bit value, and the method further comprises replacing during test pattern closure each don't-care bit of the compacted test pattern with the bit value of the care bit preceding the don't care bit in the sequence.

According to another embodiment, the method further comprises determining one or more of the following for each clock gate of a plurality of clock gates of the integrated circuit, wherein each clock gate controls whether a plurality of flip-flops receive a clock pulse: identity of each clock gate; identity of care bit states to enable each clock gate; identity of care bit states to disable each clock gate; number of flip-flops controlled by each clock gate; and physical location of the plurality of flip-flops controlled by each clock gate.

In an embodiment a computer-readable non-transitory storage medium having stored thereon a plurality of instructions is disclosed. Said plurality of instructions when executed by a computer, cause said computer to perform: receiving a plurality of test patterns from a test pattern generator to be applied to an integrated circuit, each test pattern comprising a plurality of care bits and a plurality of don't-care bits; selecting a first one of the plurality of test patterns; selecting a second one of the plurality of test patterns; determining whether to merge the second one of the plurality of test patterns with the first one of the plurality of test patterns, using a plurality of criteria ordered and applied according to a hierarchy; and if the second one of the plurality of test patterns meets each of the plurality of criteria for the first one of the plurality of test patterns, merging the second one of the plurality of test patterns with the first one of the plurality of test patterns, thereby forming a compacted test pattern.

According to another embodiment, the plurality of instructions cause the computer to further perform: selecting a third one of the plurality of test patterns; determining whether to merge the third one of the plurality of test patterns with the compacted test pattern, using the plurality of criteria ordered and applied according to the hierarchy; and if the third one of the plurality of test patterns meets each of the plurality of criteria for the compacted test pattern, merging the third one of the plurality of test patterns with the compacted test pattern, thereby forming a new compacted test pattern.

According to another embodiment, the plurality of care bits includes one or more clock gate care bits, a clock gate of a plurality of clock gates of the integrated circuit receives the one or more clock gate care bits to specify an enabled state or a disabled state for the clock gate, the clock gate controls whether a plurality of flip-flops receive a clock pulse, and a criteria of the plurality of criteria imposes an upper limit for a count of flip-flops receiving the clock pulse.

According to another embodiment, the plurality of instructions cause the computer to further perform, for each clock gate of a plurality of clock gates of the integrated circuit, determining a count of flip-flops to receive a clock pulse from the clock gate.

According to another embodiment, the plurality of care bits includes one or more clock gate care bits, a clock gate of the plurality of clock gates receives the one or more clock gate care bits to specify an enabled state or a disabled state for the clock gate, the clock gate controls whether a plurality of flip-flops receive a clock pulse, and a criteria of the plurality of criteria imposes an upper limit for a count of flip-flops receiving the clock pulse.

According to another embodiment, a criteria of the plurality of criteria imposes an upper limit on count of flip-flops within an area of the integrated circuit.

According to another embodiment, a criteria of the plurality of criteria imposes a requirement to merge that the first one of the plurality of test patterns have no conflicting care bits with the second one of the plurality of test patterns.

According to another embodiment, the plurality of instructions cause the computer to further perform analyzing a frequency of value changing of care bits, according to a proposed combination of the first one of the plurality of test patterns with the second one of the plurality of test patterns to generate a toggle count.

According to another embodiment, the plurality of care bits includes one or more clock gate care bits, a clock gate of a plurality of clock gates of the integrated circuit receives the one or more clock gate care bits to specify an enabled state or a disabled state for the clock gate, the clock gate controls whether a plurality of flip-flops receive a clock pulse, and a criteria of the plurality of criteria imposes an upper limit on the toggle count.

According to another embodiment, the compacted test pattern comprises a plurality of care bits and a plurality of don't-care bits arranged in a sequence, each care bit having a bit value, and the plurality of instruction cause the computer to further perform replacing during test pattern closure each don't-care bit of the compacted test pattern with the bit value of the care bit preceding the don't care bit in the sequence.

According to another embodiment, the plurality of instructions cause the computer to further perform determining one or more of the following for each clock gate of a plurality of clock gates of the integrated circuit, wherein each clock gate controls whether a plurality of flip-flops receive a clock pulse: identity of each clock gate; identity of care bit states to enable each clock gate; identity of care bit states to disable each clock gate; number of flip-flops controlled by each clock gate; and physical location of the plurality of flip-flops controlled by each clock gate.

In an embodiment a method of testing an integrated circuit having a plurality of scan chains comprises receiving a plurality of test patterns from a test pattern generator to be applied to an integrated circuit, each test pattern of the plurality of test patterns comprising a plurality of care bits and a plurality of don't-care bits; compacting a first set of one or more test patterns of the plurality of test patterns to form a first compacted test pattern; selecting a first one of the plurality of test patterns; determining whether to merge the first one of the plurality of test patterns with the first compacted test pattern, using a plurality of criteria ordered and applied according to a hierarchy; and if the first one of the plurality of test patterns meets each of the plurality of criteria for the first compacted test pattern, merging the first one of the plurality of test patterns with the first compacted test pattern, thereby forming a new first compacted test pattern.

According to another embodiment, the method further comprises compacting a second set of one or more test patterns of the plurality of test patterns to form a second compacted test pattern; if the first one of the plurality of test patterns does not meet one or more of the plurality of criteria for the first compacted test pattern, determining whether to merge the first one of the plurality of test patterns with the second compacted test pattern, using the plurality of criteria ordered and applied according to the hierarchy; and if the first one of the plurality of test patterns meets each of the plurality of criteria for the second compacted test pattern, merging the first one of the plurality of test patterns with the second compacted test pattern, thereby forming a new second compacted test pattern.

According to another embodiment, the plurality of care bits include one or more clock gate care bits, a clock gate of a plurality of clock gates of the integrated circuit receives the one or more clock gate care bits to specify an enabled state or a disabled state for the clock gate, and a criteria of the plurality of criteria comprises one or more: an upper limit for a count of a plurality of flip-flops receiving a clock pulse, wherein the clock gate controls whether the plurality of flip-flops receive the clock pulse; a lower limit for a count of the plurality of flip-flops receiving the clock pulse; an upper limit on a count of flip-flops within an area of the integrated circuit; a requirement to merge that the single test pattern have no conflicting care bits with the first compacted test pattern; and an upper limit on a scan toggle count determined from a proposed combination of the single test pattern with the first compacted test pattern.

According to another embodiment, the method further comprises determining one or more of the following for each clock gate of a plurality of clock gates of the integrated circuit, wherein each clock gate controls whether a plurality of flip-flops receive a clock pulse: identity of each clock gate; identity of care bit states to enable each clock gate; identity of care bit states to disable each clock gate; number of flip-flops controlled by each clock gate; and physical location of the plurality of flip-flops controlled by each clock gate.

In an embodiment, a computer-readable non-transitory storage medium having stored thereon a plurality of instructions is disclosed. Said plurality of instructions when executed by a computer, cause said computer to perform: receiving a plurality of test patterns from a test pattern generator to be applied to an integrated circuit, each test pattern of the plurality of test patterns comprising a plurality of care bits and a plurality of don't-care bits; compacting a first set of one or more test patterns of the plurality of test patterns to form a first compacted test pattern; selecting a first one of the plurality of test patterns; determining whether to merge the first one of the plurality of test patterns with the first compacted test pattern, using a plurality of criteria ordered and applied according to a hierarchy; and if the first one of the plurality of test patterns meets each of the plurality of criteria for the first compacted test pattern, merging the first one of the plurality of test patterns with the first compacted test pattern, thereby forming a new first compacted test pattern.

According to another embodiment, the plurality of instructions cause the computer to further perform: compacting a second set of one or more test patterns of the plurality of test patterns to form a second compacted test pattern; if the first one of the plurality of test patterns does not meet one or more of the plurality of criteria for the first compacted test pattern, determining whether to merge the first one of the plurality of test patterns with the second compacted test pattern, using the plurality of criteria ordered and applied according to the hierarchy; and if the first one of the plurality of test patterns meets each of the plurality of criteria for the second compacted test pattern, merging the first one of the plurality of test patterns with the second compacted test pattern, thereby forming a new second compacted test pattern.

According to another embodiment, the plurality of care bits include one or more clock gate care bits, wherein a clock gate of a plurality of clock gates of the integrated circuit receives the one or more clock gate care bits to specify an enabled state or a disabled state for the clock gate, and wherein a criteria of the plurality of criteria comprises one or more: an upper limit for a count of a plurality of flip-flops receiving a clock pulse, wherein the clock gate controls whether the plurality of flip-flops receive the clock pulse; a lower limit for a count of the plurality of flip-flops receiving the clock pulse; an upper limit on a count of flip-flops within an area of the integrated circuit; a requirement to merge that the single test pattern have no conflicting care bits with the first compacted test pattern; and an upper limit on a scan toggle count determined from a proposed combination of the single test pattern with the first compacted test pattern.

According to another embodiment, the plurality of instructions cause the computer to further perform determining one or more of the following for each clock gate of a plurality of clock gates of the integrated circuit, wherein each clock gate controls whether a plurality of flip-flops receive a clock pulse: identity of each clock gate; identity of care bit states to enable each clock gate; identity of care bit states to disable each clock gate; number of flip-flops controlled by each clock gate; and physical location of the plurality of flip-flops controlled by each clock gate.

The above and other preferred features described herein, including various novel details of implementation and combination of elements, will now be more particularly described with reference to the accompanying drawings and pointed out in the claims. It will be understood that the particular methods and apparatuses are shown by way of illustration only and not as limitations of the claims. As will be understood by those skilled in the art, the principles and features of the teachings herein may be employed in various and numerous embodiments without departing from the scope of the claims.

BRIEF DESCRIPTION OF THE DRAWINGS

The accompanying drawings, which are included as part of the present specification, illustrate the presently preferred embodiments and together with the general description given above and the detailed description of the preferred embodiments given below serve to explain and teach the principles described herein.

Figure 1:
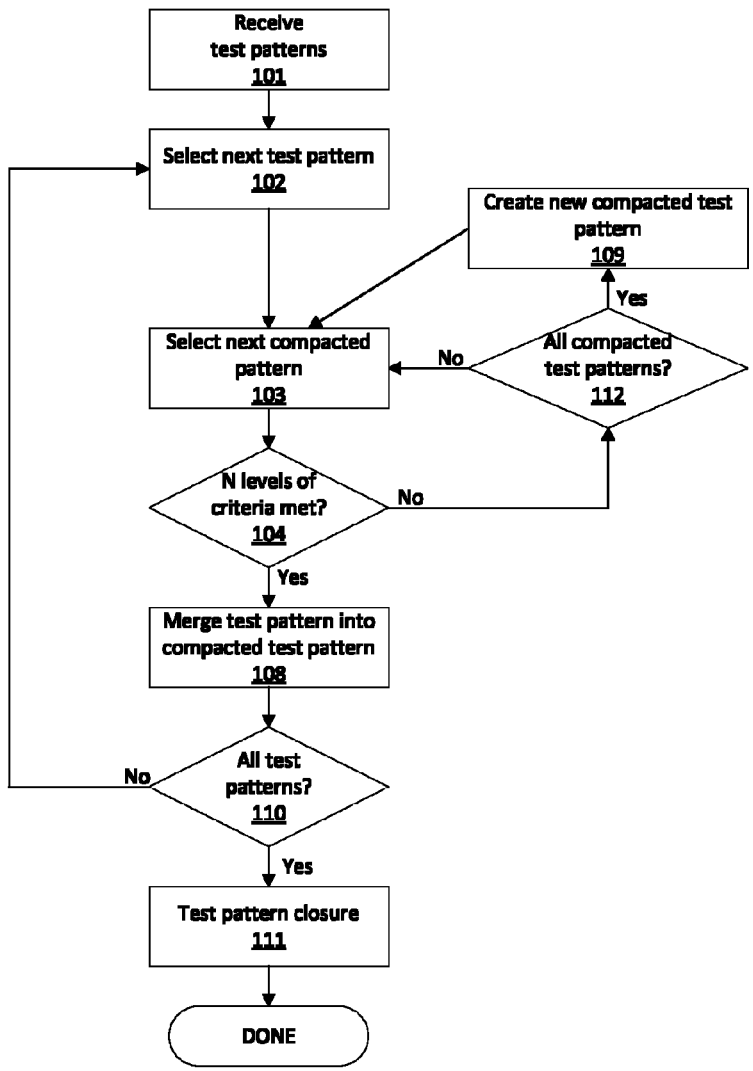
FIG. 1 is an illustration of a flow for compacting a set of test patterns according to a hierarchy having a variable number of levels.

The figures are not necessarily drawn to scale and the elements of similar structures or functions are generally represented by like reference numerals for illustrative purposes throughout the figures. The figures are only intended to facilitate the description of the various embodiments described herein; the figures do not describe every aspect of the teachings disclosed herein and do not limit the scope of the claims.

DETAILED DESCRIPTION

A method and apparatus for hierarchical compaction of test patterns to be applied to an integrated circuit during test is disclosed. Each of the features and teachings disclosed herein can be utilized separately or in conjunction with other features and teachings. Representative examples utilizing many of these additional features and teachings, both separately and in combination, are described in further detail with reference to the attached drawings. This detailed description is merely intended to teach a person of skill in the art further details for practicing preferred aspects of the present teachings and is not intended to limit the scope of the claims. Therefore, combinations of features disclosed in the following detailed description may not be necessary to practice the teachings in the broadest sense, and are instead taught merely to describe particularly representative examples of the present teachings.

In the following description, for purposes of explanation only, specific nomenclature is set forth to provide a thorough understanding of the various embodiments described herein. However, it will be apparent to one skilled in the art that these specific details are not required to practice the concepts described herein.

Some portions of the detailed descriptions that follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Also disclosed is an apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk, including flip-floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms presented herein are not inherently related to any particular computer or other apparatus. Various general purpose systems may be used with programs in accordance with the teachings herein, or it may prove convenient to construct a more specialized apparatus to perform the required method steps. The required structure for a variety of these systems will appear from the description below. It will be appreciated that a variety of programming languages may be used to implement the present teachings.

Moreover, the various features of the representative examples and the dependent claims may be combined in ways that are not specifically and explicitly enumerated in order to provide additional useful embodiments of the present teachings. It is also expressly noted that all value ranges or indications of groups of entities disclose every possible intermediate value or intermediate entity for the purpose of original disclosure, as well as for the purpose of restricting the claimed subject matter. It is also expressly noted that the dimensions and the shapes of the components shown in the figures are designed to help to understand how the present teachings are practiced, but not intended to limit the dimensions and the shapes shown in the examples.

Compaction of test patterns using current techniques seek to maximize the number of individual test's care bits into a single test pattern. The care bits are determined by the test generator, or ATPG, as the values needed at specified locations in the test pattern to help detect a specific fault. The method is to minimize the total number of test patterns going to the ATE tester, thereby reducing test time. Reduction of test time is a direct cost savings to the end product being tested.

When nothing other than a maximum compaction of the test's care bits is taken into account, the test and design are exposed to other issues. One of these issues is excess power during the test, for both scan and capture portions of the test. If not taken into account the product being tested can be damaged or give indications of false failures, which will impact yield of the product being developed. Lower yield and damage can also directly affect the cost of the product being tested.

The disclosed embodiments relate to the hierarchical compaction of test patterns to manage a circuit design's power dissipation during test. Specifically, to the release or capture portion of the test patterns generated by ATPG, and the density of the care bits within a test pattern. At a high level, the solution is a hierarchical strategy for categorizing test patterns for compaction that provides fine grained control of low power constraints.

To address the problem, the care bits of a test pattern cannot be treated equally. Care bits can be examined to determine their function and place them into a category (e.g. involved with clock gate control, involved with memory controls). Categories that are identified for a test pattern set can be used to create a level within the hierarchy of compaction. Other criteria can then be used to create further levels with the compaction hierarchy in addition to the categories. A pattern must meet the criteria of all levels within a hierarchical column to be considered for compaction.

Each time a test pattern has reached a defined criterion for a category (e.g. the total number of flip-flops being clocked at one time or during the test); it is set as a filter for the proceeding patterns. Those test patterns that meet the criterion of this level are passed to the next level of that category. Once all the criteria have been met for each level of the category, the test pattern will be merged into the solution for that category. If at any time it fails to meet that criterion it will be moved to the next hierarchical compaction category for consideration. If the test pattern meets none of the defined hierarchical compaction categories then it will become a new one in the chained link of hierarchical compaction categories.

FIG. 1 is an illustration of an exemplary program flow according to an embodiment. This flow can be implemented in software, or a combination of software and hardware, on a computer system (workstation). The computer system includes one or more processors, a user interface, a memory device, a storage device, a system bus, and one or more bus interface for connecting the processor, user interface, memory device, storage device, and system bus. The processor may be a central processing unit (CPU), application-specific integrated circuit, programmed field-programmable gate arrays, or any other suitable processing unit. The computer system can also include one or more network devices for interfacing with a network of other computers.

At step 101 of the flow, a set of test patterns are received from an ATPG. For most ATPG's, the test patterns are not ordered. The ATPG process does not need to run to completion before the flow moves to step 102. Rather, the flow can proceed as long as test patterns are available at step 102, with the ATPG continuing to supply test patterns as they are generated. At step 102, the next test pattern (which may be the first test pattern) received from the ATPG is retrieved for consideration. The test pattern is considered against a first compacted test pattern at step 103. Each test pattern will be considered against a compacted test pattern, which is retrieved at step 103. Each compacted test pattern will comprise a test pattern previously considered or a compacted form of a plurality of test patterns previously considered. The compacted test pattern may also be empty if the test pattern considered is the very first test pattern. As the flow continues, more and more compacted test patterns will be generated. Once all the test patterns are considered, decided at step 110, the program flow moves to test pattern closure at step 111, then completes the process having generated a set of compacted test patterns.

Generically, step 104 applies a set of N criteria in a hierarchy to compact test patterns, where N is a whole number greater than one, there being N levels in the hierarchy. If all N criteria of step 104 are met, the test pattern under consideration will be compacted with the first compacted test pattern for which the test pattern meets all the criteria at step 108. If no compacted test pattern is satisfactory, a new compacted test pattern is created for the test pattern under consideration.

During step 104, the first level criteria is applied. If the criteria is met, the test pattern proceeds to the second level criteria. But, if the first level criteria is not met for this first compacted test pattern, the test pattern will be considered against the set of criteria for the second compacted test pattern, if such second compacted test pattern exists. Step 112 queries whether such a second compacted test pattern exists. If a second compacted test pattern exists, e.g. not all the compacted test patterns have been considered for the particular test pattern, then the program flow proceeds to consider the next pattern group back at step 103. The first level criteria will again be applied to the test pattern, but now for the second compacted test pattern. If the first level criteria is met during step 104, but second level criteria is not met, the program will again check to see if there is a next compacted test pattern (for example, a third compacted test pattern) available for consideration at step 112 and retrieve that compacted test pattern at step 103, again applying all the level criteria. Any third level criteria (if N is at least three) and the fourth level criteria (if N is at least four) are similarly applied to the test pattern under consideration for each test pattern during step 104, but only if the prior criteria are met. Step 104 proceeds for each N level of criteria.

If all the criteria are not met for a test pattern under consideration, and every existing compacted test pattern has been considered, then a new compacted test pattern is generated at step 109. At first, the new compacted test pattern will reflect the contents of the test pattern under consideration. However, subsequent test patterns will consider the new compacted test pattern for compaction if the test patterns do not meet the criteria of prior compacted test patterns, and these test patterns may be merged with the new compacted test pattern.

Once all test patterns of the set of test patterns generated by the ATPG have been considered in the hierarchy (see step 110) the program moves to test pattern closure step 111. The care bits have already been compacted and a set of compacted test patterns generated. However, the compacted test patterns only contain care bits. Test pattern closure fills in the don't-care bits of the compacted test patterns. The "don't care" bits are those bits in the test patterns other than the care bits. One method to fill in the don't care bits is to randomly assign either a 1 or a 0 to the don't care bit. However, this introduces more unnecessary switching activity for the flip-flops than is desirable for a low-power solution.

According to an embodiment, the don't care bits are assigned to lessen switching activity. To accomplish this, each don't care bit is filled with the value of the preceding care bit. Thus, switching only occurs from care bit to care bit, but switching may not even occur between care bits if the adjacent care bits share a common value. Table 1 illustrates such a technique for an exemplary thirty-two bit compacted test pattern, where row A shows the bit numbers, row B is the compacted test pattern having only care bits, and row C is the filled in bit pattern group. After test pattern closure, the compacted test patterns are ready to be applied to the chip by the ATE.

TABLE 1

| | 31 | 30 | 29 | 28 | 27 | 26 | 25 | 24 | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|---|---|---|---|---|---|---|---|---|
| A: | X | 1 | X | X | 0 | X | X | X | X | X | 0 | X | 1 | X | 1 | X | X | 0 | 0 | X | X | 1 | X | X | X | 1 | X | X | 0 | X | X | 0 |
| B: | 1 | 1 | 0 | 0 | 0 | 0 | 0 | 0 | 0 | 0 | 0 | 1 | 1 | 1 | 1 | 0 | 0 | 0 | 1 | 1 | 1 | 1 | 1 | 1 | 1 | 1 | 0 | 0 | 0 | 1 | 1 | 1 |
| C: |   |   |   |   |   |   |   |   |   |   |   |   |   |   |   |   |   |   | 1 |   |   |   |   |   |   |   |   |   |   |   |   | 1 |

Figure 2:
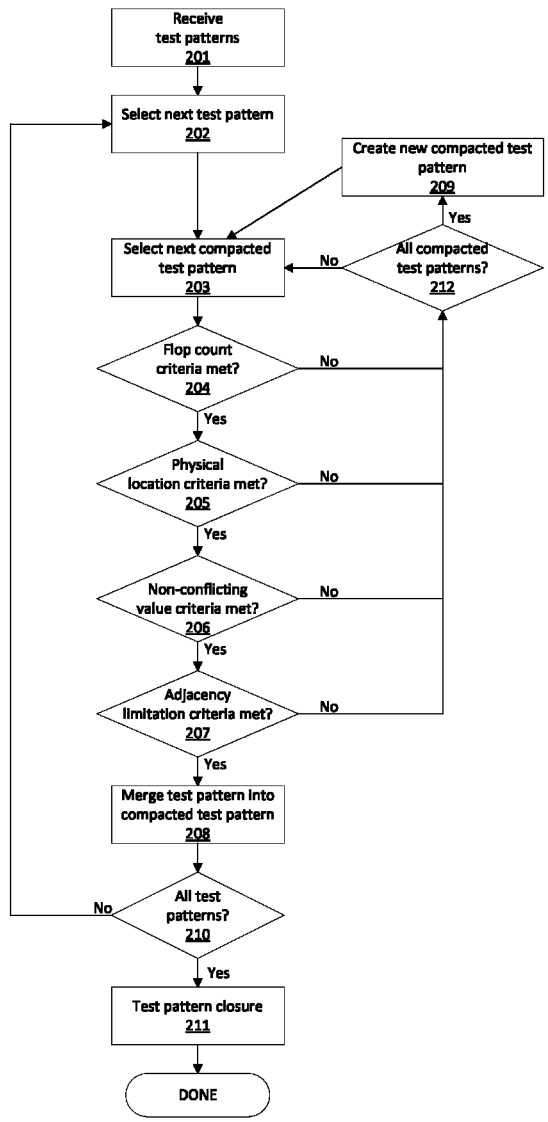
FIG. 2 is an illustration of a flow for compacting a set of test patterns according to a hierarchy having four criteria levels.

FIG. 2 is an illustration of an exemplary program flow according to an embodiment. This flow can be implemented in software, or a combination of software and hardware, on a computer system (workstation). The computer system includes one or more processors, a user interface, a memory device, a storage device, a system bus, and one or more bus interface for connecting the processor, user interface, memory device, storage device, and system bus. The processor may be a central processing unit (CPU), application-specific integrated circuit, programmed field-programmable gate arrays, or any other suitable processing unit. The computer system can also include one or more network devices for interfacing with a network of other computers.

The above-discussed criteria to be applied include criteria for the care bits that manage various power issues. The chosen criteria and hierarchy help manage localized power issues during launch and capture of test patterns, as well as during pattern scan shift. The criteria to be applied separate the compaction into four distinct layers, each regarding certain care bits. First, care bits controlling clock gates based on the count of controlled flip-flops. Second, care bits controlling clock gates based on the physical location of the flip-flops controlled by the clock gates. Third, care bits for non-clock gate control which have no conflicting values. Fourth and finally, care bits for non-clock gate control which have no conflicting values, and also meeting adjacency limitations for the scanned portion. Each criteria will be discussed in more detail below.

At step 201 of the flow, a set of test patterns are received from an ATPG. For most ATPG's, the test patterns are not ordered. The ATPG process does not need to run to completion before the flow moves to step 202. Rather, the flow can proceed as long as test patterns are available at step 202, with the ATPG continuing to supply test patterns as they are generated. At step 202, the next test pattern (which may be the first test pattern) received from the ATPG is retrieved. The test pattern is considered against a first compacted test pattern at step 203. Each test pattern will be considered against a compacted test pattern, which is retrieved at step 203. Each compacted test pattern will comprise a test pattern previously considered or a compacted form of a plurality of test patterns previously considered. The compacted test pattern may also be empty if the test pattern considered is the very first test pattern. As the flow continues, more and more compacted test patterns will be generated. Once all the test patterns are considered, decided at step 210, the program flow moves to test pattern closure at step 211, then completes the process having generated a set of compacted test patterns.

Steps 204 through 207 apply a set of four criteria in a hierarchy to compact test patterns.

At step 204 the criteria of the first compaction layer is applied, the first compaction layer relating to care bits controlling clock gates based on the count of flip-flops controlled by the clock gates. Information from the analysis of the relationship between clock gates and their respective flip-flops may be used. For the scan portion of a test pattern, all clock gates are usually enabled, being controlled by a scan enable test control signal to allow for the flip-flops to receive clock pulses for the scan portion of the test pattern, i.e. load and unload. For the release or capture portion of the test pattern, ATPG usually enables clock gates that are needed to capture the design's behavior to its stimulus. Once the affected clock gates have been enabled for the test pattern, the total number of flip-flops that will receive a clock pulse will need to be tracked. The maximum switching for the release or capture portion of the test pattern would be if all enabled flip-flops change value. This will be the upper limit for switching.

At the first level of compaction, the number of flip-flops receiving a clock pulse within the combined pattern should not exceed the limit set for the pattern generation. Then, once the limit of flip-flops activated has been reached, test patterns that utilize the same clock gates are then looked for to compact.

At step 205 the criteria of the second compaction layer is applied, the second compaction layer relating to care bits controlling clock gates, and takes into account the physical location of the flip-flops controlled by a clock gate. One of the goals of this layer is to prevent active flip-flops from clustering. In this layer, the total number of flip-flops receiving a clock pulse is limited to a certain number in a particular area of the integrated circuit. This limit helps manage local power issues during pattern launch and capture. For example, if too many flip-flops receive a clock pulse within in a localized area of the design, IR drop can occur even if there is a low average number of flip-flops capturing data across the entire integrated circuit: localized switching effects must also be taken into account so that hot spots are not created.

Clock gating is a technique used to save power during operation of a chip by pruning a section of the clock tree, whereby a gate is inserted in the clock tree to prevent clock signals from reaching a portion of the chip. This prevents switching of that portion's flip-flops, effectively disabling that portion of the circuit.

One of the primary ways of controlling power during the release or capture portion of test pattern application is to shut down certain clock gates within the design. Certain of the care bits in a test pattern can control the clock gates. Like during operation, when a clock gate is disabled then the controlled flip-flops will be unable to change value from the applied test stimulus and will be unable to capture the behavior resulting from that applied stimulus. In addition, the care bit will disable a portion of the clock tree, which saves power.

Figure 3:
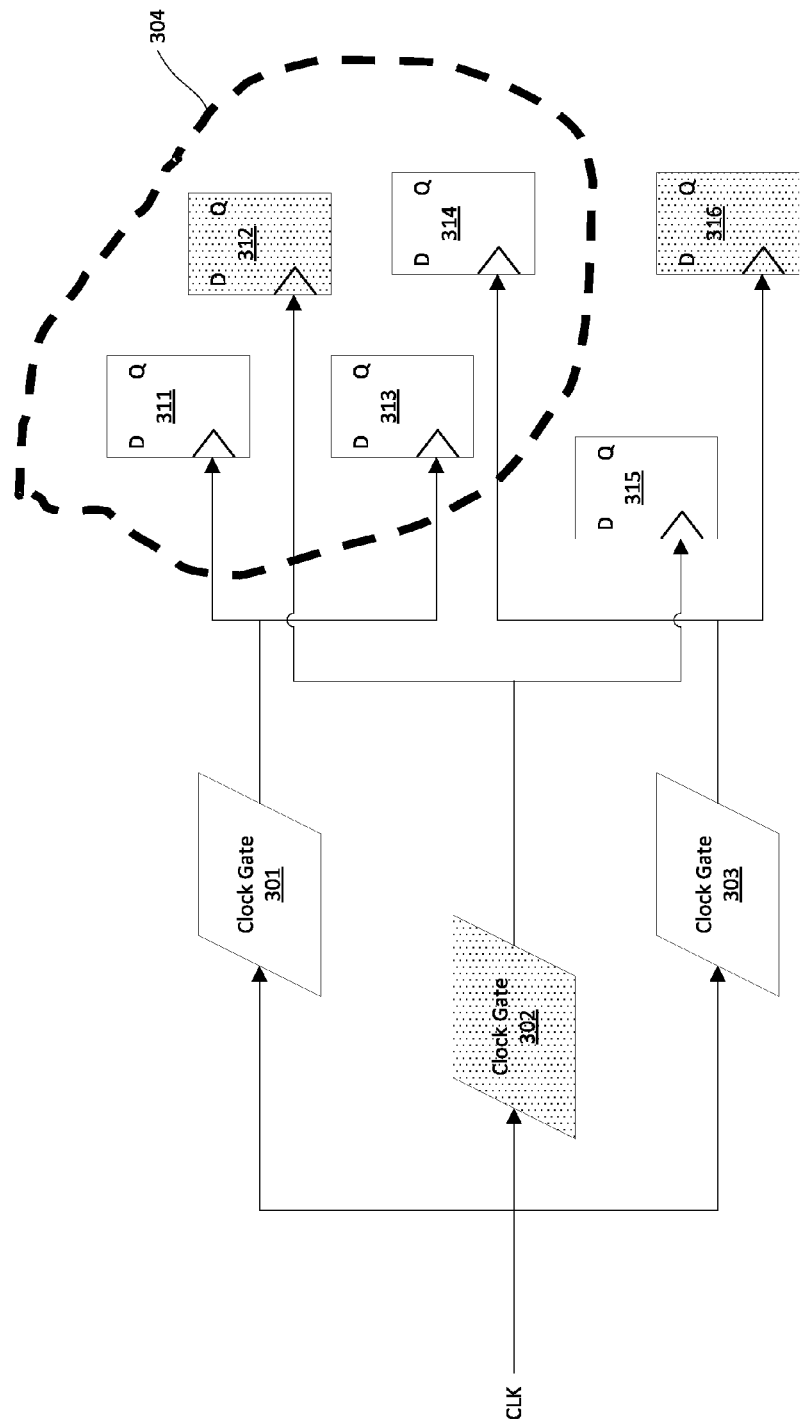
FIG. 3 is an illustration of clock gate control of flip-flops.

FIG. 3 is an illustration of a simple clock gating scheme for six flip-flops. Clock gates 301, 302 and 303 receive signal clock signal CLK at their inputs. Depending on whether they are open or closed, each of clock gates 301, 302, and 303 allow the clock signal to pass to the input of a flip-flop. The output of clock gate 301 is connected to the clock input of flip-flops 311 and 313. The output of clock gate 302 is connected to the clock input of flip-flops 312 and 315. The output of clock gate 303 is connected to the clock input of flip-flops 314 and 316. In an example, a hot spot 304 may develop, including flip-flops 311-314. In order to control the hot spot, for example, clock gate 302 is disabled such that flip-flops 311, 313, 314, and 316 will be active, but flip-flops 312 and 315 will be disabled. This reduces switching activity within hot spot 304. Switching activity outside of host spot 304 may also be affected, for example flip-flop 315 is disabled even though it falls outside the hot spot.

In the second compaction layer, if a test pattern will contribute to the hot spot 304 over a defined limit for the criteria, then the test pattern is rejected as not meeting that criteria.

At step 206 the criteria of the third compaction layer is applied, the third compaction layer relating to care bits for non-clock gate control which have no conflicting values. This compaction layer follows an approach whereby as long as none of the care bits are in conflict, the test patterns are merged. If there is a conflict, the merging is not possible, and the test pattern is moved on to the next group.

Table 2 illustrates the technique of the third compaction layer for an exemplary thirty-two bit compacted test pattern, where row A shows the bit numbers, row B is the first test pattern having "1" or "0" care bits and "X" don't care bits, row C is the second test pattern having "1" or "0" care bits and "X" don't care bits, and row D is the compacted test pattern.

TABLE 2

| | 31 | 30 | 29 | 28 | 27 | 26 | 25 | 24 | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|---|---|---|---|---|---|---|---|---|
| A: | X | 1 | X | X | 0 | X | X | X | X | X | 0 | X | 1 | X | 1 | X | X | 0 | 0 | X | X | 1 | X | X | X | 1 | X | X | 0 | X | 1 | 0 |
| B: | 0 | 1 | X | X | X | 0 | X | 1 | X | 1 | 0 | X | X | 1 | X | X | X | X | 1 | X | 0 | X | X | 1 | 0 | X | X | X | 0 | X | X | 1 |
| C: | 1 | 1 | X | X | 0 | 0 | X | 1 | X | 1 | 0 | X | 1 | 1 | 1 | X | X | 0 | 1 | X | 0 | 1 | X | 1 | 0 | 1 | X | X | 0 | X | 1 | X |
| D: | 0 | 1 | X | X | 0 | 0 | X | 1 | X | 1 | 0 | X | 1 | 1 | 1 | X | X | 0 | 1 | X | 0 | 1 | X | 1 | 0 | 1 | X | X | 0 | X | 1 | 1 |

For bit 0 (row A), the first test pattern (row B) is a "1" and the second test pattern (row C) is a don't care bit. The merged pattern group (row D) will be a "1." For bit 1, the first test pattern is a don't care bit and the second test pattern is a "1." The merged pattern will again be a "1." For bit 3, the first test pattern is a "0" and the second test pattern is a "0." The merged pattern will again be a "0" because the bit values do not conflict.

At step 207 the criteria of the fourth compaction layer is applied, the fourth compaction layer relating to care bits meeting adjacency limitations for the scan loading portion. The fourth compaction layer affects scan load switching during the scan load process more than release or capture switching within the test pattern. The care bits being setup in the flip-flops, as well as those flip-flops' positions within a scan chain, are examined. During the scan load process, when a transition from one flip-flop to another occurs and the value changes, the switching creates a power drain. If these transitions occur repeatedly back to back, the power drain during scan shift can exceed the power grid capability to deliver the needed current to maintain value levels for a particular technology. This may seem to effect only the scan load stage of the scan portion, but in combination with clock gate control, the scan effects will be transferred to the scan unload stage since the design's behavior will not be captured into the flip-flops.

Referring to Table 3, row B illustrates a first 16-bit test pattern, row A showing the bit numbers. In row B, a "1" or a "0" is a care bit and an "X" is a don't care bit. Care bits are placed into the flip-flops based on whether they are needed for stimulus of a test pattern. Referring to row B, it can be seen that there are four transitions that will occur, either a 0→1 or a 1→0 transition, from right to left, the first between bits 3 and 5, the second between bits 5 and 8, the third between bits 8 and 9, and the fourth between bits 11 and 14. Each "X" don't care bit does not create a transition.

TABLE 3

| A: | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| B: | X | 0 | X | X | 1 | X | 1 | 0 | X | X | 1 | X | 0 | X | X | X |

Now consider a first test pattern of row B compacted with a second test pattern of row C illustrated in Table 4. The first test pattern shows 3 transitions. The second test pattern shows 5 transitions. However, after compaction, the number of transitions increases greatly. As illustrated in row D, the compacted test pattern shows eleven transitions. Just looking at the two patterns separately, there is no conflict, but the switching across the compacted test pattern toggles and draws power on every shift cycle. This constant power draw, if clocked at a frequency high enough to not allow for the power grid to recover, can deliver false failures on the tester. These failures impact yield and can also damage the die being tested. Guidelines can be set up for the frequency of switching occurrences for the care bits in a test pattern. Without guidelines, a compacted pattern can be a source of failure on the tester due to the power draw.

TABLE 4

| A: | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|
| B: | X | X | 1 | 0 | X | 0 | X | X | 1 | 0 | X | X | X | X | X | X |
| C: | X | 0 | X | X | 1 | X | 1 | 0 | X | X | 1 | 0 | 1 | X | X | X |
| D: | X | 0 | 1 | 0 | 1 | 0 | 1 | 0 | 1 | 0 | 1 | 0 | 1 | X | X | X |

The fourth level of compaction is most effective on a final netlist, once scan chain reordering has occurred, because further reordering will likely change whether care bits are adjacent for at least some of the care-bits.

If all of the criteria of steps 204 through 207 are met, the test pattern under consideration will be compacted with the first compacted test pattern for which the test pattern meets all the criteria at step 208. If no compacted test pattern is satisfactory, a new compacted test pattern is created for the test pattern under consideration at step 209. At first, the new compacted test pattern will reflect the contents of the test pattern under consideration. However, subsequent test patterns will consider the new compacted test pattern for compaction if the test patterns do not meet the criteria of prior compacted test patterns, and these test patterns may be merged with the new compacted test pattern.

Once all test patterns of the set of test patterns generated by the ATPG have been considered in the hierarchy (see step 210) the program moves to test pattern closure step 211. Test pattern closure step 211 is substantially the same as test pattern closure step 111 previously discussed in another embodiment.

According to another embodiment, a minimum limit can also be used to ensure a sufficient amount of switching activity for the flip-flops of a circuit design during test. It is sometimes desirable to stress the circuit design. The compacted test patterns can be evaluated, as part of the test pattern closure step prior to filling in the don't care bits, to determine whether a minimum amount of flip-flop switching activity results from the application of the test patterns to the integrated circuit. While Table 1 illustrates a technique known as repeat-fill to lessen switching activity, if the minimum amount for switching activity is not met according to evaluation during the test pattern closure step, the compacted test patterns can be filled to increase flip-flop switching activity by replacing the don't care bits with bits that increase rather than decrease the frequency of value changing in the compacted test patterns. Switching activity can be increased by adding random bits while monitoring the criteria of the hierarchy to ensure that the criteria are not violated as a result of the random fill. Switching activity can be increased during scan, capture, or both. For example, the total switching activity can be evaluated while still maintaining a maximum switching activity within a confined physical location of the integrated circuit design by increasing the frequency of value changing in the compacted test patterns only for care bits corresponding to areas of the integrated circuit design outside a confined physical location.

Steps 204 through 207 may be reordered in a different hierarchy according to another embodiment. For example, step 207 may proceed first, followed next by step 206, then next by step 205, and lastly (and just prior to step 210) by step 204. Other orders are also possible according to this embodiment.

According to another embodiment, other compaction layers are added to the hierarchical compaction scheme. According to another embodiment, one or more of compaction layers of steps 204 through 207 may be removed from the hierarchical compaction scheme, and can be replaced with compaction layers having other criteria. Such other criteria are those relating to care bits for flip-flops having a greater sensitivity to noise than other flip-flops of the circuit design, care bits for flip-flops having a greater sensitivity to IR-drop, care bits for flip-flops having a particular physical density, and care bits for flip-flops within a certain proximity to a power pin of the circuit design.

An analysis of clock gates can be performed prior to when test pattern compaction begins in another embodiment. The pre-analysis can be performed by software running on the same workstation that performs test-pattern compaction according to the disclosed flows described herein, or can be performed by software written specifically for such analysis. The results of this analysis can then be used during the compaction process to provide supplemental information for the criteria applied to pick test patterns to be compacted into a compacted test pattern. This analysis looks at both the clock gates and the flip-flops that correspond to each of the clock gates. The information obtained for the clock gates is associated with each clock gate.

Figure 4:
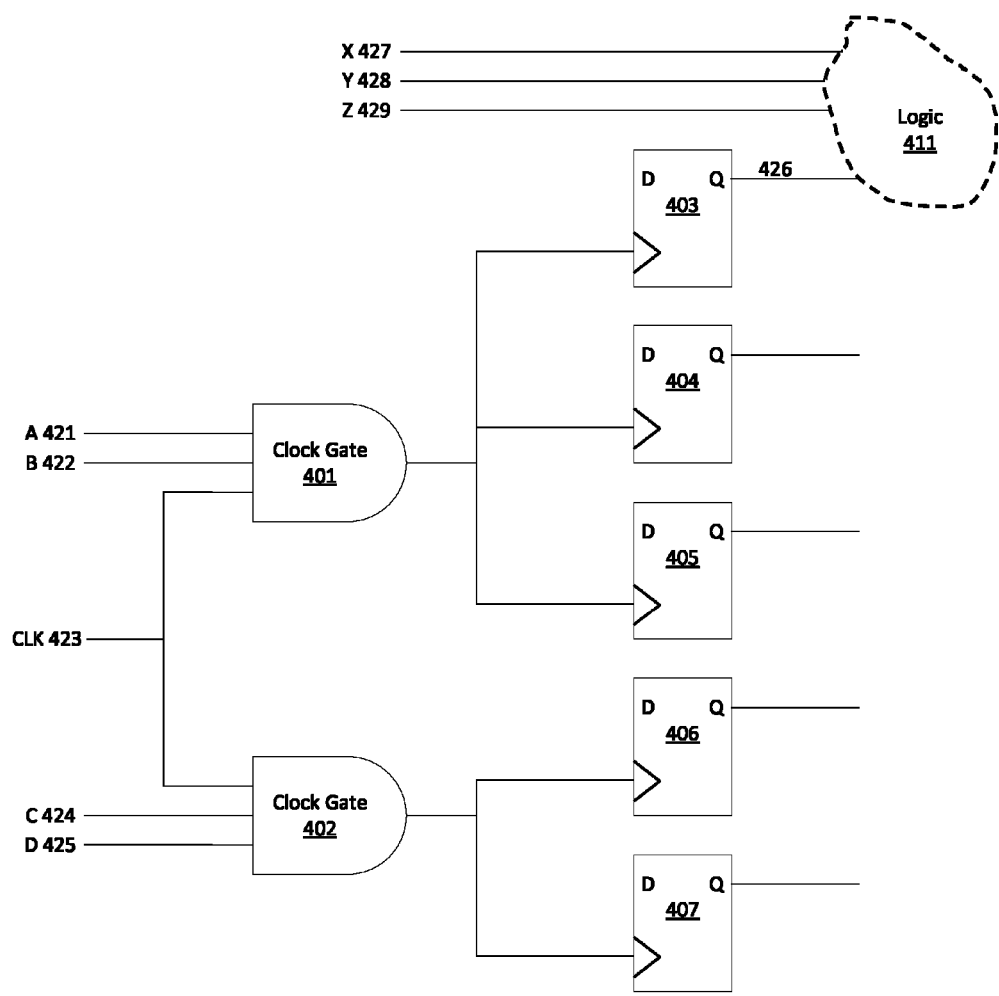
FIG. 4 is another illustration of clock gate control of flip-flops.

As a first step, the analysis identifies each of the clock gates in the design. Each clock gate controls a number of flip-flops, allowing the clock signal to reach or not reach the flip-flops depending on whether the clock gate is enabled or disabled. Second, the number of flip-flops controlled by each clock gate are determined. The number of flip-flops controlled by a clock gate impacts the additional power consumed when the clock gate is enabled or, conversely, the power saved when the clock gate is disabled. Third, the states of the care bits to enable clock gates are determined, and the states of the care bits to disable clock gates are determined. Only some of the care bits affect clock gates; the care bit states that enable clock gates and the care bit states that disable clock gates are identified in the analysis. Finally, the physical location of the flip-flops controlled by each clock gate is determined. The physical location refers to the flip-flops' location in the integrated circuit layout as defined by geometric coordinates relative to other flip-flops and the remaining circuit elements of the integrated circuit. FIG. 4 illustrates a portion of a simplified circuit design showing two clock gates, according to an embodiment. A first clock gate 401 receives clock signal CLK 423 and enable signal A 421 and enable signal B 422. Clock gate 401 controls whether three flip-flops 403, 404, and 405 receive clock signal 423. The output 426 of flip-flop 403 is an input to additional logic 411. Logic 411 also receives input signals X 427, Y 428, and Z 429. A second clock gate 402 receives the clock signal CLK 423 and enable signal C 424 and enable signal D 425. Clock gate 402 controls whether two flip-flops 406 and 407 receive clock signal 423.

Here, first the analysis determines the number of clock gates, which is two: clock gates 401 and 402. Second, the number of controlled flip-flops is determined: three flip-flops for clock gate 401, and two flip-flops for clock gate 402. Third, the care bit states to enable the clock gates are determined. Here, each of the clock gates 401 and 402 are three-input AND gates. Therefore, for clock gate 401 there is one care bit state requiring two care bit 1's to enable clock gate 401: care bit 1 for signal A 421 together with care bit 1 for signal B 422. Clock gate 402 similarly has one care bit state to enable it. However, there are three care bit states that disable each of the clock gates. Any of the following disable clock gate 401: (i) care bit 1 for signal A 421 together with care bit 0 for signal B 422, (ii) care bit 0 for signal A 421 together with care bit 1 for signal B 422, or (iii) care bit 0 for signal A 421 together with care bit 0 for signal B 422. Clock gate 402 similarly has three disabling care bit states.

In the above description, the clock gates 401 and 402 are implemented as a 3-input AND gate. According to other embodiments, clock gates can be implemented as a latch element together with an AND gate, a latch plus an OR gate, or any number of similar implementations. In still other embodiments, clock gates can be arranged hierarchically, such that a higher-level clock gate controls several lower-level clock gates.

Although various embodiments have been described with respect to specific examples and subsystems, it will be apparent to those of ordinary skill in the art that the concepts disclosed herein are not limited to these specific examples or subsystems but extends to other embodiments as well. Included within the scope of these concepts are all of these other embodiments as specified in the claims that follow.

We claim:

1. A method of testing an integrated circuit having a plurality of scan chains, comprising:
  receiving a plurality of test patterns from a test pattern generator to be applied to an integrated circuit, each test pattern comprising a plurality of care bits and a plurality of don't-care bits;
  selecting a first one of the plurality of test patterns;
  selecting a second one of the plurality of test patterns;
  determining whether to merge the second one of the plurality of test patterns with the first one of the plurality of test patterns to generate a merged test pattern, using a plurality of criteria ordered and applied according to a hierarchy, each of the plurality of criteria comprising a level of the hierarchy;
    wherein a first level of the hierarchy comprises a determination that the number of flip-flops receiving a clock pulse within the merged test pattern does not exceed a preset limit;
    wherein a second level of the hierarchy comprises a determination that the total number of flip-flops that will store the merged test pattern is limited to a preselected number within a predetermined area of the integrated circuit;
    wherein a third level of the hierarchy comprises determining that the plurality of care bits for non-clock control in the merged test pattern does not exceed a predetermined number of adjacent transitions have conflicting values;
    wherein a fourth level of the hierarchy comprises determining that the plurality of care bits of the merged test pattern does not exceed a predetermined number of adjacent transitions;
  if the merged test pattern meets each of the first level of the hierarchy, second level of the hierarchy, third level of the hierarchy and fourth level of the hierarchy, merging the second one of the plurality of test patterns with the first one of the plurality of test patterns, thereby forming a compacted test pattern.

2. The method of testing an integrated circuit of claim 1, further comprising: selecting a third one of the plurality of test patterns;
  determining whether to merge the third one of the plurality of test patterns with the compacted test pattern, using the plurality of criteria ordered and applied according to the hierarchy; and
  if the third one of the plurality of test patterns meets each of the plurality of criteria for the compacted test pattern, merging the third one of the plurality of test patterns with the compacted test pattern, thereby forming a new compacted test pattern.

3. The method of testing an integrated circuit of claim 1, wherein the plurality of care bits includes one or more clock gate care bits, wherein a clock gate of a plurality of clock gates of the integrated circuit receives the one or more clock gate care bits to specify an enabled state or a disabled state for the clock gate, wherein the clock gate controls whether a plurality of flip-flops receive a clock pulse, and wherein a criteria of the plurality of criteria imposes an upper limit for a count of flip-flops receiving the clock pulse.

4. The method of testing an integrated circuit of claim 3, further comprising, for each clock gate of a plurality of clock gates of the integrated circuit, determining a count of flip-flops to receive a clock pulse from the clock gate.

5. The method of testing an integrated circuit of claim 4, wherein the plurality of care bits includes one or more clock gate care bits, wherein a clock gate of the plurality of clock gates receives the one or more clock gate care bits to specify an enabled state or a disabled state for the clock gate, wherein the clock gate controls whether a plurality of flip-flops receive a clock pulse, and wherein a criteria of the plurality of criteria imposes an upper limit for a count of flip-flops receiving the clock pulse.

6. The method of testing an integrated circuit of claim 1, wherein a criteria of the plurality of criteria imposes an upper limit on count of flip-flops within an area of the integrated circuit.

7. The method of testing an integrated circuit of claim 1, wherein a criteria of the plurality of criteria imposes a requirement to merge that the first one of the plurality of test patterns have no conflicting care bits with the second one of the plurality of test patterns.

8. The method of testing an integrated circuit of claim 1, further comprising analyzing a frequency of value changing of care bits, according to a proposed combination of the first one of the plurality of test patterns with the second one of the plurality of test patterns to generate a toggle count.

9. The method of testing an integrated circuit of claim 8, wherein the plurality of care bits includes one or more clock gate care bits, wherein a clock gate of a plurality of clock gates of the integrated circuit receives the one or more clock gate care bits to specify an enabled state or a disabled state for the clock gate, wherein the clock gate controls whether a plurality of flip-flops receive a Clock pulse, and wherein a criteria of the plurality of criteria imposes an upper limit on the toggle count.

10. The method of testing an integrated circuit of claim 1, wherein the compacted test pattern comprises a plurality of care bits and a plurality of don't-care bits arranged in a sequence, each care bit having a bit value, further comprising:
replacing during test pattern closure each don't-care bit of the compacted test pattern with the bit value of the care bit preceding the don't care bit in the sequence.

11. The method of testing an integrated circuit of claim 3, further comprising determining one or more of the following for each clock gate of a plurality of clock gates of the integrated circuit, wherein each clock gate controls whether a plurality of flip-flops receive a clock pulse:
identity of each clock gate;
identity of care bit states to enable each clock gate;
identity of care bit states to disable each clock gate;
number of flip-flops controlled by each clock gate; and
physical location of the plurality of flip-flops controlled by each clock gate.

12. A computer-readable non-transitory storage medium having stored thereon a plurality of instructions, said plurality of instructions when executed by a computer, cause said computer to perform:
receiving a plurality of test patterns from a test pattern generator to be applied to an integrated circuit, each test pattern comprising a plurality of care bits and a plurality of don't-care bits;
selecting a first one of the plurality of test patterns;
selecting a second one of the plurality of test patterns;
determining whether to merge the second one of the plurality of test patterns with the first one of the plurality of test patterns to generate a merged test pattern, using a plurality of criteria ordered and applied according to a hierarchy, each of the plurality of criteria comprising a level of the hierarchy;
wherein a first level of the hierarchy comprises a determination that the number of flip-flops receiving a clock pulse within the merged test pattern does not exceed a preset limit;
wherein a second level of the hierarchy comprises a determination that the total number of flip-flops that will store the merged test pattern is limited to a preselected number within a predetermined area of the integrated circuit;
wherein a third level of the hierarchy comprises determining that the plurality of care bits for non-clock control in the merged test pattern does not exceed a predetermined number of adjacent transitions have conflicting values;
wherein a fourth level of the hierarchy comprises determining that the plurality of care bits of the merged test pattern does not exceed a predetermined number of adjacent transitions;
if the merged test pattern meets each of the first level of the hierarchy, second level of the hierarchy, third level of the hierarchy and fourth level of the hierarchy, merging the second one of the plurality of test patterns with the first one of the plurality of test patterns, thereby forming a compacted test pattern.

13. The computer-readable non-transitory storage medium of claim 12, wherein the plurality of instructions cause the computer to further perform:
selecting a third one of the plurality of test patterns;
determining whether to merge the third one of the plurality of test patterns with the compacted test pattern, using the plurality of criteria ordered and applied according to the hierarchy; and
if the third one of the plurality of test patterns meets each of the plurality of criteria for the compacted test pattern, merging the third one of the plurality of test patterns with the compacted test pattern, thereby forming a new compacted test pattern.

14. The computer-readable non-transitory storage medium of claim 12, wherein the plurality of care bits includes one or more clock gate care bits, wherein a clock gate of a plurality of clock gates of the integrated circuit receives the one or more clock gate care bits to specify an enabled state or a disabled state for the clock gate, wherein the clock gate controls whether a plurality of flip-flops receive a clock pulse, and wherein a criteria of the plurality of criteria imposes an upper limit for a count of flip-flops receiving the clock pulse.

15. The computer-readable non-transitory storage medium of claim 14, wherein the plurality of instructions cause the computer to further perform, for each clock gate of a plurality of clock gates of the integrated circuit, determining a count of flip-flops to receive a clock pulse from the clock gate.

16. The computer-readable non-transitory storage medium of claim 15, wherein the plurality of care bits includes one or more clock gate care bits, wherein a clock gate of the plurality of clock gates receives the one or more clock gate care bits to specify an enabled state or a disabled state for the clock gate, wherein the clock gate controls whether a plurality of flip-flops receive a clock pulse, and wherein a criteria of the plurality of criteria imposes an upper limit for a count of flip-flops receiving the clock pulse.

17. The computer-readable non-transitory storage medium of claim 12, wherein a criteria of the plurality of criteria imposes an upper limit on count of flip-flops within an area of the integrated circuit.

18. The computer-readable non-transitory storage medium of claim 12, wherein a criteria of the plurality of criteria imposes a requirement to merge that the first one of the plurality of test patterns have no conflicting care bits with the second one of the plurality of test patterns.

19. The computer-readable non-transitory storage medium of claim 12, wherein the plurality of instructions cause the computer to further perform analyzing a frequency of value changing of care bits, according to a proposed combination of the first one of the plurality of test patterns with the second one of the plurality of test patterns to generate a toggle count.

20. The computer-readable non-transitory storage medium of claim 19, wherein the plurality of care bits includes one or more clock gate care bits, wherein a clock gate of a plurality of clock gates of the integrated circuit receives the one or more clock gate care bits to specify an enabled state or a disabled state for the clock gate, wherein the clock gate controls whether a plurality of flip-flops receive a clock pulse, and wherein a criteria of the plurality of criteria imposes an upper limit on the toggle count.

21. The computer-readable non-transitory storage medium of claim 12, wherein the compacted test pattern comprises a plurality of care bits and a plurality of don't-care bits arranged in a sequence, each care bit having a bit value, and wherein the plurality of instruction cause the computer to further perform replacing during test pattern closure each don't-care bit of the compacted test pattern with the bit value of the care bit preceding the don't care bit in the sequence.

22. The computer-readable non-transitory storage medium of claim 14, wherein the plurality of instructions cause the computer to further perform determining one or more of the following for each clock gate of a plurality of clock gates of the integrated circuit, wherein each clock gate controls whether a plurality of flip-flops receive a clock pulse:
   identity of each clock gate;
   identity of care bit states to enable each clock gate;
   identity of care bit states to disable each clock gate;
   number of flip-flops controlled by each clock gate; and
   physical location of the plurality of flip-flops controlled by each clock gate.

23. A method of testing an integrated circuit having a plurality of scan chains, comprising:
   receiving a plurality of test patterns from a test pattern generator to be applied to an integrated circuit, each test pattern of the plurality of test patterns comprising a plurality of care bits and a plurality of don't-care bits;
   compacting a first set of one or more test patterns of the plurality of test patterns to form a first compacted test pattern;
   selecting a first one of the plurality of test patterns;
   determining whether to merge the first one of the plurality of test patterns with the first compacted test pattern to generate a merged test pattern, using a plurality of criteria ordered and applied according to a hierarchy, each of the plurality of criteria comprising a level of the hierarchy;
      wherein a first level of the hierarchy comprises a determination that the number of flip-flops receiving a clock pulse within the merged test pattern does not exceed a preset limit;
      wherein a second level of the hierarchy comprises a determination that the total number of flip-flops that will store the merged test pattern is limited to a preselected number within a predetermined area of the integrated circuit;
      wherein a third level of the hierarchy comprises determining that the plurality of care bits for non-clock control in the merged test pattern does not exceed a predetermined number of adjacent transitions have conflicting values;
      wherein a fourth level of the hierarchy comprises determining that the plurality of care bits of the merged test pattern does not exceed a predetermined number of adjacent transitions;
   if the merged test pattern meets each of the first level of the hierarchy, second level of the hierarchy, third level of the hierarchy and fourth level of the hierarchy, merging the first one of the plurality of test patterns with the first compacted test pattern, thereby forming a new first compacted test pattern.

24. The method of testing an integrated circuit of claim 23, further comprising: compacting a second set of one or more test patterns of the plurality of test patterns to form a second compacted test pattern;
   if the first one of the plurality of test patterns does not meet one or more of the plurality of criteria for the first compacted test pattern, determining whether to merge the first one of the plurality of test patterns with the second compacted test pattern, using the plurality of criteria ordered and applied according to the hierarchy; and
   if the first one of the plurality of test patterns meets each of the plurality of criteria for the second compacted test pattern, merging the first one of the plurality of test patterns with the second compacted test pattern, thereby forming a new second compacted test pattern.

25. The method of testing an integrated circuit of claim 23, wherein the plurality of care bits include one or more clock gate care bits, wherein a clock gate of a plurality of clock gates of the integrated circuit receives the one or more clock gate care bits to specify an enabled state or a disabled state for the clock gate, and wherein a criteria of the plurality of criteria comprises one or more:
   an upper limit for a count of a plurality of flip-flops receiving a clock pulse, wherein the clock gate controls whether the plurality of flip-flops receive the clock pulse; a lower limit for a count of the plurality of flip-flops receiving the clock pulse; an upper limit on a count of flip-flops within an area of the integrated circuit;
   a requirement to merge that the single test pattern have no conflicting care bits with the first compacted test pattern; and
   an upper limit on a scan toggle count determined from a proposed combination of the single test pattern with the first compacted test pattern.

26. The method of testing an integrated circuit of claim 25, further comprising determining one or more of the following for each clock gate of a plurality of clock gates of the integrated circuit, wherein each clock gate controls whether a plurality of flip-flops receive a clock pulse:
   identity of each clock gate;
   identity of care bit states to enable each clock gate;
   identity of care bit states to disable each clock gate;
   number of flip-flops controlled by each clock gate; and
   physical location of the plurality of flip-flops controlled by each clock gate.

27. A computer-readable non-transitory storage medium having stored thereon a plurality of instructions, said plurality of instructions when executed by a computer, cause said computer to perform:
   receiving a plurality of test patterns from a test pattern generator to be applied to an integrated circuit, each test pattern of the plurality of test patterns comprising a plurality of care bits and a plurality of don't-care bits;
   compacting a first set of one or more test patterns of the plurality of test patterns to form a first compacted test pattern;
   selecting a first one of the plurality of test patterns;
   determining whether to merge the first one of the plurality of test patterns with the first compacted test pattern to generate a merged test pattern, using a plurality of criteria ordered and applied according to a hierarchy, each of the plurality of criteria comprising a level of the hierarchy;

wherein a first level of the hierarchy comprises a determination that the number of flip-flops receiving a clock pulse within the merged test pattern does not exceed a preset limit;

wherein a second level of the hierarchy comprises a determination that the total number of flip-flops that will store the merged test pattern is limited to a preselected number within a predetermined area of the integrated circuit;

wherein a third level of the hierarchy comprises determining that the plurality of care bits for non-clock control in the merged test pattern does not exceed a predetermined number of adjacent transitions have conflicting values;

wherein a fourth level of the hierarchy comprises determining that the plurality of care bits of the merged test pattern does not exceed a predetermined number of adjacent transitions;

if the merged test pattern meets each of the first level of the hierarchy, second level of the hierarchy, third level of the hierarchy and fourth level of the hierarchy, merging the first one of the plurality of test patterns with the first compacted test pattern, thereby forming a new first compacted test pattern.

28. The computer-readable non-transitory storage medium of claim 27, wherein the plurality of instructions cause the computer to further perform:

compacting a second set of one or more test patterns of the plurality of test patterns to form a second compacted test pattern;

if the first one of the plurality of test patterns does not meet one or more of the plurality of criteria for the first compacted test pattern, determining whether to merge the first one of the plurality of test patterns with the second compacted test pattern, using the plurality of criteria ordered and applied according to the hierarchy; and if the first one of the plurality of test patterns meets each of the plurality of criteria for the second compacted test pattern, merging the first one of the plurality of test patterns with the second compacted test pattern, thereby forming a new second compacted test pattern.

29. The computer-readable non-transitory storage medium of claim 27, wherein the plurality of care bits include one or more clock gate care bits, wherein a clock gate of a plurality of clock gates of the integrated circuit receives the one or more clock gate care bits to specify an enabled state or a disabled state for the clock gate, and wherein a criteria of the plurality of criteria comprises one or more:

an upper limit for a count of a plurality of flip-flops receiving a clock pulse, wherein the clock gate controls whether the plurality of flip-flops receive the clock pulse; a lower limit for a count of the plurality of flip-flops receiving the clock pulse; an upper limit on a count of flip-flops within an area of the integrated circuit; a requirement to merge that the single test pattern have no conflicting care bits with the first compacted test pattern; and an upper limit on a scan toggle count determined from a proposed combination of the single test pattern with the first compacted test pattern.

30. The computer-readable non-transitory storage medium of claim 29, wherein the plurality of instructions cause the computer to further perform determining one or more of the following for each clock gate of a plurality of clock gates of the integrated circuit, wherein each clock gate controls whether a plurality of flip-flops receive a clock pulse:

identity of each clock gate;
identity of care bit states to enable each clock gate;
identity of care bit states to disable each clock gate;
number of flip-flops controlled by each clock gate; and
physical location of the plurality of flip-flops controlled by each clock gate.

* * * * *